United States Patent
Gamble, IV et al.

(10) Patent No.: US 10,002,328 B1
(45) Date of Patent: Jun. 19, 2018

(54) ELECTRON SPIN-BASED INFORMATION SHUTTLING FOR A COMPUTER SYSTEM

(71) Applicant: National Technology & Engineering Solutions of Sandia, LLC, Albuquerque, NM (US)

(72) Inventors: John King Gamble, IV, Albuquerque, NM (US); Malcolm S. Carroll, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days. days.

(21) Appl. No.: 15/381,819

(22) Filed: Dec. 16, 2016

(51) Int. Cl.
  *G06N 99/00* (2010.01)
  *H01L 29/41* (2006.01)
  *H01L 29/24* (2006.01)
  *B82Y 10/00* (2011.01)

(52) U.S. Cl.
  CPC ............ *G06N 99/002* (2013.01); *B82Y 10/00* (2013.01); *H01L 29/24* (2013.01); *H01L 29/413* (2013.01)

(58) Field of Classification Search
  CPC ..... G06N 99/002; H01L 29/24; H01L 29/413; B82Y 10/00
  See application file for complete search history.

(56) References Cited

U.S. PATENT DOCUMENTS 4,345,207 A * 8/1982 Bertrand ................ G01R 33/46
  324/308

OTHER PUBLICATIONS

Friesen et al., "Efficient Multiqubit Entanglement via a Spin Bus", Physical Review Letters, vol. 98, Jun. 2007, pp. 230503-1-230503-4.
Greentree et al., "Coherent electronic transfer in quantum dot systems using adiabatic passage", Physical Review B, vol. 70, Dec. 2004, pp. 235317-1-235317-6.
Liu et al., "Photon-Emission from a Cavity-Coupled Double Quantum Dot", Physical Review Letters, vol. 113, Jul. 2014, pp. 036801-1-036801-5.
Shulman et al., "Demonstration of Entanglement of Electrostatically Coupled Singlet-Triplet Qubits", Science, vol. 336, Apr. 2012, pp. 202-205.
Taylor et al., "Fault-tolerant architecture for quantum computation using electrically controlled semiconductor spins", Mature Physics, vol. 1, Dec. 2005, pp. 177-183.
Veldhorst et al., "A two-qubit logic gate in silicon", Nature, vol. 526, Oct. 2015, pp. 410-414.

* cited by examiner

*Primary Examiner* — Jung Kim
(74) *Attorney, Agent, or Firm* — Yee & Associates, P.C.; Gregory M. Doudnikoff

(57) ABSTRACT

A silicon metal-oxide semiconductor device transports a spin-polarized single electron. An array of silicon quantum dot electrodes is arranged atop a silicon dioxide layer of a silicon metal-oxide semiconductor. The array comprises at least a first electrode and a second electrode adjacent to the first electrode. A transport control logic for individually controls a voltage applied to the electrodes. The transport control logic is configured to gradually decrease a voltage at the first electrode while gradually increasing a voltage at the second electrode. Localization of the single electron is adiabatically transferred from the first electrode to the second electrode while maintaining a desired energy gap between a ground state and a first excited state of the single electron.

23 Claims, 11 Drawing Sheets

US 10,002,328 B1

ELECTRON SPIN-BASED INFORMATION SHUTTLING FOR A COMPUTER SYSTEM

GOVERNMENT LICENSE RIGHTS

This invention was made with United States Government support under Contract No. DE-AC04-94AL85000 between Sandia Corporation and the United States Department of Energy. The United States Government has certain rights in this invention.

BACKGROUND INFORMATION

1. Field

The present disclosure relates generally to an improved computer system and, in particular, to a method and apparatus for shuttling information bits in a computer system. Still more particularly, the present disclosure relates to a method and apparatus for shuttling spin-based information bits in a silicon metal oxide semiconductor device computer system.

2. Background

A bit is a basic unit of information in a classical computer system. Conventionally, classical information storage devices encode two different states classified with the labels of "0" and "1". In this case, a quantity of coding a bit state is determined based on the laws of classical physics.

A quantum bit, or qubit, is a basic unit of information in quantum computers. A qubit may indicate at least two different quantities and may be an actual physical device in which information is stored or may be a unit of information extracted from a physical qubit device.

Like a classical bit, a qubit may include two different physical states classified with the labels of "0" and "1". However, in this scenario, a quantity of coding a bit state is determined based on the laws of quantum physics. Thus, if a physical quantity stores the states quantum mechanically, a quantum information storage device may be additionally located in the superposition between "0" and "1". That is, the qubit may exist in both "0" and "1" states at the same time, and thus, quantum computation with regard to both of the "0" and "1" states may be performed at the same time. Therefore, it may be understood that a qubit having a pure discrete state (0 or 1) is in a classical state and a qubit with a superposition of states is in a quantum state. Accordingly, N qubits may be in a superposition of up to $2^N$ states.

In spin-based quantum computers in electronic systems, qubits are stored in the spin state of a single electron. Spin states in semiconductor systems exhibit excellent coherence and operational properties. Spin-based quantum information processing relies on the ability to store, transport and manipulate the spin polarization of a single electron.

However, the very features of single electron spin states that lead to these appealing properties make semiconductor qubits difficult to couple over large distances. A variety of solutions have been proposed, including spin buses, coherent tunneling, cavity coupling, direct exchange, and capacitive coupling.

However, these existing solutions for transporting the electron spin polarization have proven to be more difficult than desired when applied to low temperature silicon quantum dots. Compared with gallium-arsenide, electron spin polarization in silicon systems is more sensitive to disorder due to silicon's low-lying valley states and larger effective mass. This disorder sensitivity renders high-fidelity transport more difficult than desired.

Therefore, it would be desirable to have a method and apparatus that takes into account at least some of the issues discussed above, as well as other possible issues. For example, it would be desirable to have a method and apparatus that overcomes the technical problem of shuttling spin-based information bits in a silicon metal oxide semiconductor computer system.

SUMMARY

An embodiment of the present disclosure provides a silicon metal-oxide semiconductor device for transporting a spin-polarized single electron. An array of silicon quantum dot electrodes is arranged atop a silicon dioxide layer of a silicon metal-oxide semiconductor. The array comprises at least a first electrode and a second electrode adjacent to the first electrode. A transport control logic individually controls a voltage applied to the electrodes. The transport control logic is configured to gradually decrease a voltage at the first electrode while gradually increasing a voltage at the second electrode. Localization of the single electron is adiabatically transferred from the first electrode to the second electrode while maintaining a desired energy gap between a ground state and a first excited state of the single electron.

Another embodiment of the present disclosure provides a method for transporting a spin-polarized single electron in a silicon metal-oxide semiconductor device. The method comprises providing a single spin-polarized electron localized at a first electrode in an array of silicon quantum dot electrodes by a voltage applied at the first electrode. The array comprises at least the first electrode and a second electrode adjacent to the first electrode. The method further comprises gradually decreasing the voltage at the first electrode. The method further comprises gradually increasing a voltage at the second electrode while decreasing the voltage at the first electrode. The single electron is adiabatically transferred from the first electrode to the second electrode while maintaining a desired energy gap between a ground state and a first excited state of the single electron.

Yet another embodiment of the present disclosure provides a computer program product for transporting information indicated by a spin polarization of a single electron in a silicon metal-oxide semiconductor device. The computer program product comprises a computer readable storage media. First program code is stored on the computer readable storage media, and when executed, provides a single spin-polarized electron localized at a first electrode in an array of silicon quantum dot electrodes by a voltage applied at the first electrode. The array comprises at least the first electrode and a second electrode adjacent to the first electrode. Second program code, stored on the computer readable storage media, and when executed, gradually decreases the voltage at the first electrode. Third program code, stored on the computer readable storage media, and when executed, gradually increases a voltage at the second electrode while decreasing the voltage at the first electrode. The single electron is adiabatically transferred from the first electrode to the second electrode while maintaining a desired energy gap between a ground state and a first excited state of the single electron.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that maintaining transport fidelity of spin-polarized electrons in silicon metal oxide semiconductor devices may be more difficult than desired, especially in disordered systems.

Thus, the illustrative embodiments provide a method and apparatus for transporting a spin-polarized single electron in a silicon metal-oxide semiconductor device. In one illustrative example, a silicon metal oxide semiconductor device may include a group of silicon quantum dot electrodes arranged atop a silicon dioxide layer of a silicon metal-oxide semiconductor, wherein the group comprises at least a first electrode and a second electrode adjacent to the first electrode. The silicon metal oxide semiconductor device may also include a power manager having a transport control logic for individually controlling a voltage applied to the electrodes. The transport control logic is configured to gradually decrease a voltage at the first electrode while gradually increase a voltage at the second electrode such that localization of the single electron is adiabatically transferred from the first electrode to the second electrode while maintaining a desired energy gap between a ground state and a first excited state of the single electron. As used herein, a "group of" when used with reference items means one or more items. For example, a group of objects is one or more objects.

Figure 1:
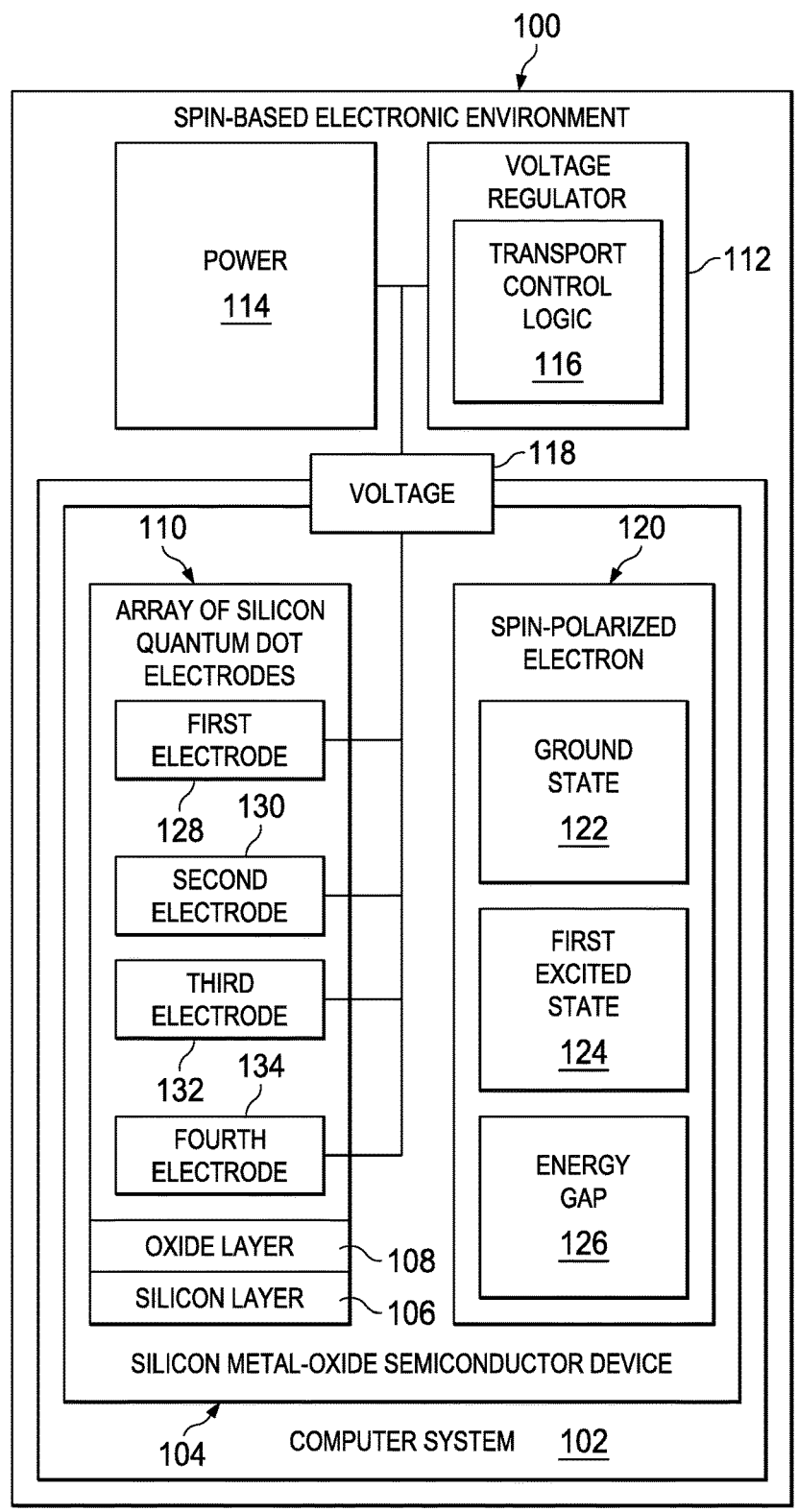
FIG. 1 is an illustration of a block diagram of a spin-based electronic environment, depicted in accordance with an illustrative embodiment.

With reference now to the figures and, in particular, with reference to FIG. 1, an illustration of a block diagram of a spin-based electronic environment is depicted in accordance with an illustrative embodiment. In this illustrative example, spin-based electronic environment 100 includes computer system 102. Computer system 102 is a hardware system and includes one or more data processing systems. When more than one data processing system is present, those data processing systems may be in communication with each other using a communications medium. The communications medium may be a network. The data processing systems may be selected from at least one of a computer, a server computer, a tablet, or some other suitable data processing system.

As used herein, the phrase "at least one of," when used with a list of items, means different combinations of one or more of the listed items may be used and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item B. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

As depicted, computer system 102 includes silicon metal oxide semiconductor device 104. silicon metal oxide semiconductor device 104 includes semi-conducting silicon layer 106, insulator oxide layer 108, and array of silicon quantum dot electrodes 110. As depicted, array of silicon quantum dot electrodes 110 are quantum dot electrodes disposed on top of oxide layer 108.

As depicted, computer system 102 includes power manager 112. As depicted, power manager 112 manages power 114 used by computer system 102.

Power manager 112 may be implemented in software, hardware, firmware, or a combination thereof. When software is used, the operations performed by power manager 112 may be implemented in program code configured to run on hardware, such as a processor unit. When firmware is used, the operations performed by power manager 112 may be implemented in program code and data and stored in persistent memory to run on a processor unit. When hardware is employed, the hardware may include circuits that operate to perform the operations in power manager 112.

In the illustrative examples, the hardware may take the form of a circuit system, an integrated circuit, an application-specific integrated circuit (ASIC), a programmable logic device, a neuromorphic computing system, or some other suitable type of hardware configured to perform a number of operations. With a programmable logic device, the device may be configured to perform the number of operations. The device may be reconfigured at a later time or may be permanently configured to perform the number of operations. Programmable logic devices include, for example, a programmable logic array, programmable array logic, a field programmable logic array, a field programmable gate array, and other suitable hardware devices. Additionally, the processes may be implemented in organic components integrated with inorganic components and may be comprised entirely of organic components excluding a human being. For example, the processes may be implemented as circuits in organic semiconductors.

As depicted, power manager 112 includes transport control logic 116. Transport control logic 116 individually controls voltage 118 applied to each of array of silicon quantum dot electrodes 110 to adiabatically transfer spin-polarized electron 120 across array of silicon quantum dot electrodes 110.

As used herein, adiabatic transfer of spin-polarized electron 120 is a process in which no quantum jump occurs. Spin-polarized electron 120 remains in ground state 122. The localization of spin-polarized electron 120 ships along array of silicon quantum dot electrodes 110 without spin-polarized electron 120 entering first excited state 124. First excited state 124 is the first excited state of spin-polarized electron 120, and is separated from ground state 122 by energy gap 126.

As depicted, array of silicon quantum dot electrodes 110 includes a first electrode 128, second electrode 130, and third electrode 132. By individually controlling voltage 118 applied to each of ray of silicon quantum dot electrodes 110, transport control logic 116 adiabatically transfer spin-polarized electron 120 from first electrode 128 to second electrode 130, and to third electrode 132, transport control logic 116 renders high-fidelity transport of spin-polarized electron 120 in a manner that is more disorder robust than previous electron transport processes.

Figure 2:
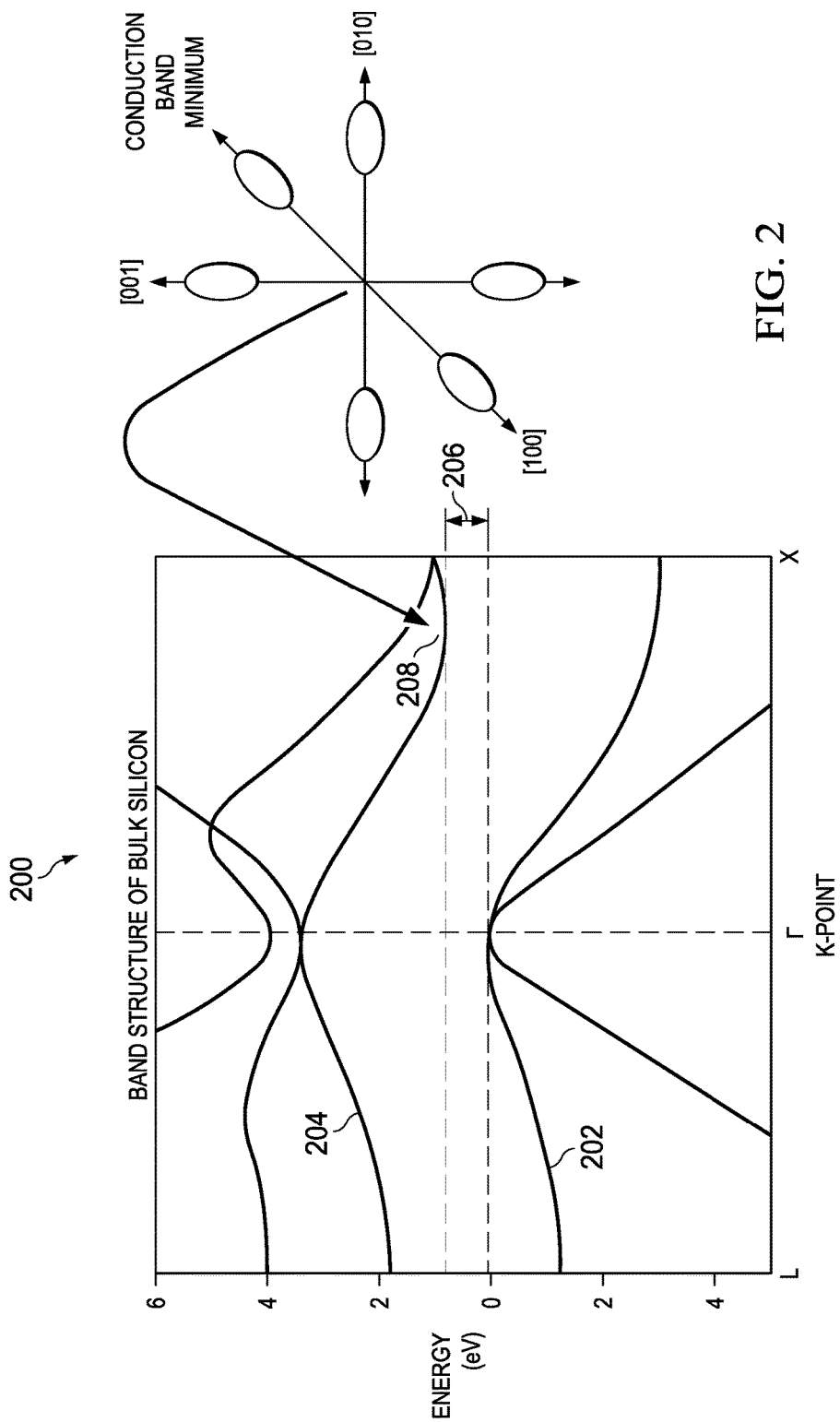
FIG. 2 is a band structure of bulk silicon, depicted according to an illustrative embodiment.

Referring now to FIG. 2, band structure 200 is depicted according to an illustrative embodiment. As depicted, band structure 200 illustrates a range of energies that may and may not be occupied by an electron such as spin-polarized electron 120 shown in FIG. 1, within a semiconductor device, such as silicon metal oxide semiconductor device 104 depicted in block form in FIG. 1. As depicted, band structure 200 is a band structure for silicon.

Band structure 200 defines the wave function of spin-polarized electron 120. The wave function of band structure 200 can be expressed as the Bloch function:

$$\psi(r) = \Sigma_j F_j(r) e^{ik_0^j \cdot r} u_{k_0^j}(r)$$

The Bloch function for band structure 200 is indexed by valleys 208 in conduction band 204. Valleys 208 in conduction band 204 can be expressed by the periodic function:

$$u_{k_0^j}(r) = \Sigma_G A_{j,G} e^{iG \cdot r}$$

Band structure 200 illustrates energy band gap 206 separating the valence band 202 and conduction band 204. As depicted, energy band gap 206 is an energy range in bulk silicon where no electron states can exist. As depicted, energy band gap 206 is the energy difference (in electron volts) between the top of valence band 202 and the bottom of conduction band 204, as indexed by valleys 208 in conduction band 204. As depicted, energy band gap 206 is the energy difference separating the highest point in valence band 202 and the lowest point of valleys 208 in conduction band 204.

According to an illustrative example, spin-polarized electron 120 of FIG. 1, resides in valleys 208 of conduction band 204. Spin-polarized electron 120 in conduction band 204 can be in ground state 122, shown in block form in FIG. 1.

Localization and energies of spin-polarized electron 120 can be determined according to a coupled system of Schrödinger-like equations, which include the valley orbit coupling:

$$EF_j(r) = (\hat{T}l + U(r)F_j(r) + \Sigma_j V_{ij}^{VO}(r) F_j(r)$$

$$V_{ij}^{VO}(r) = \Sigma_{G^l, G^j}(1 - \delta_{G^l, G^j} \delta_{j,l}) A^*_{l, G^l} A_{j, G^j} e^{ir \cdot (G^j - G^l + k_0^j - k_0^l)} U(r)$$

Spin-polarized electron 120 becomes subject to disorder when excited from its ground state to higher energy levels, decreasing the fidelity of electron transfer in a silicon metal oxide semiconductor device, such as silicon metal oxide semiconductor device 104 shown in block form in FIG. 1. To maintain spin fidelity, spin-polarized electron 120 should remain in ground state 122 during shuttling between array of silicon quantum dot electrodes 110. However, as voltage 118 is applied to each of array of silicon quantum dot electrodes 110, energy gap 126 separating ground state 122 and first excited state 124 decreases proportionally. The small effective of mass of silicon, as well as low-lying valleys 208 in which spin-polarized electron 120 resides, makes shuttling spin-polarized electrons 120 along array of silicon quantum dot electrodes 110 difficult.

Figure 3:
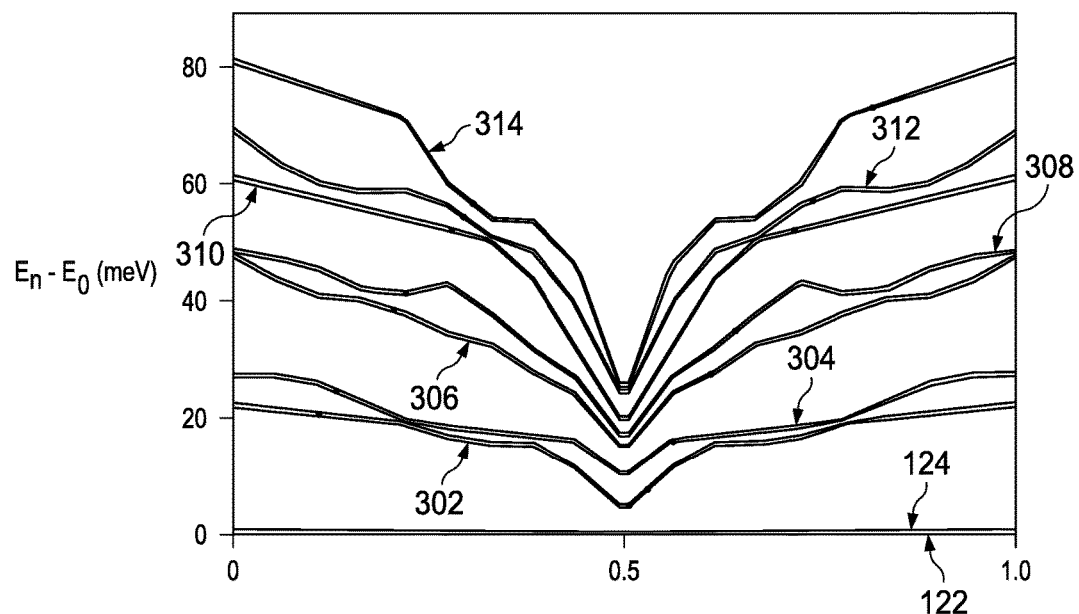
FIG. 3 is graph of energy gaps between a ground state and excited states for an conduction band electron in silicon, depicted in accordance with an illustrative embodiment.
Figure 4:
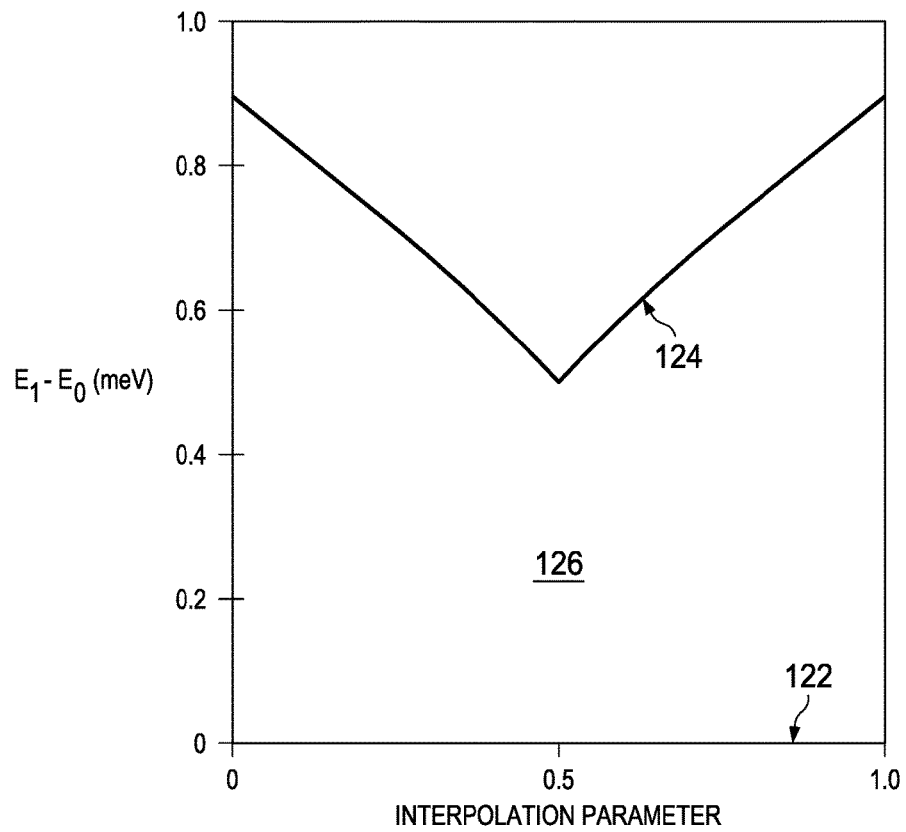
FIG. 4 is an enlarged graph of FIG. 3 the energy gap between a ground state and a first excited state for an conduction band electron in silicon, depicted in accordance with an illustrative embodiment.

With reference now to FIGS. 3 and 4, graph of energy gaps between a ground state and excited states for an electron is depicted in accordance with an illustrative embodiment. Graph 300 shows the energy gap between ground state 122 for spin polarized electrons 120, shown in block form in FIG. 1, and excited states, including first excited state 124. FIG. 4 is an enlargement of energy gap 126 between ground state 122 and first excited state 124 for spin polarized electron 120, illustrated in FIG. 3.

Graph 300 includes shows the energy gap between ground state 122 for spin-polarized electrons 120, shown in block form in FIG. 1, and various excited states. As depicted, graph 300 includes first excited state 124, second and third excited states 302, fourth and fifth excited states 304, sixth and seventh excited states 306, eighth and ninth excited states 308, tenth and eleventh excited states 310, twelfth and thirteenth excited states 312, and fourteenth and fifteenth excited states 314.

As depicted, energy gap 126 is the energy required to promote a spin-polarized electron 120, shown in block form in FIG. 1, from ground state 122 to first excited state 124. Spin-polarized electron 120 becomes subject to disorder when excited to first excited state 124, decreasing the fidelity of electron transfer in a silicon metal oxide semiconductor device, such as silicon metal oxide semiconductor device 104 shown in block form in FIG. 1.

By selectively controlling voltage 118 applied to each of array of silicon quantum dot electrodes 110, both shown in block form in FIG. 1, embodiments of the present invention are able to maintain a large energy gap 126 between ground state 122 and first excited state 124. Silicon metal oxide semiconductor device 104, shown in block form in FIG. 1, becomes more robust to disorder of electron spin, enabling high transport of spin-polarized electron 120.

Figure 5:
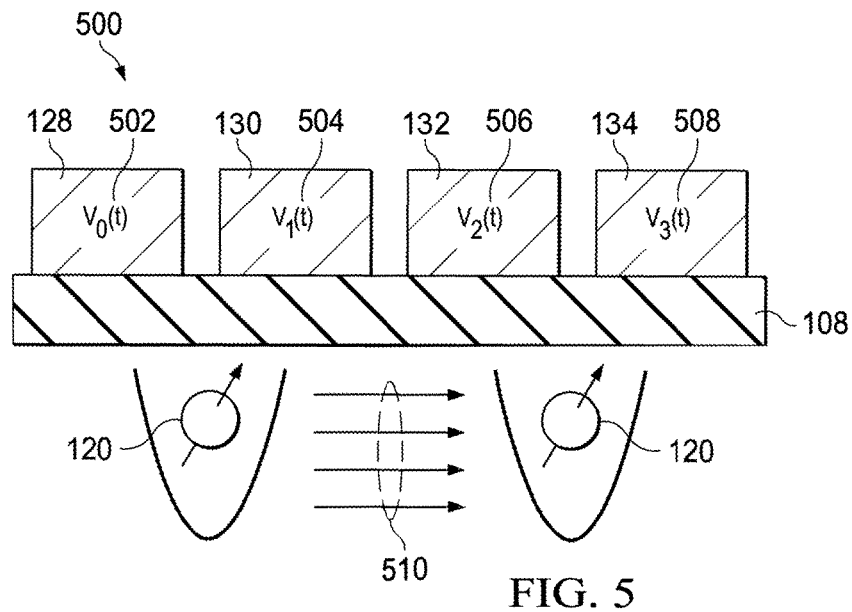
FIG. 5 is an illustration depicting the adiabatic transfer of a spin-polarized electron depicted, according to an illustrative embodiment.

Referring now to FIG. 5, an illustration depicting the adiabatic transfer of a spin-polarized electron is depicted according to an illustrative embodiment. As depicted, adiabatic transfer 500 illustrates the transfer of spin-polarized electron 120 in silicon metal oxide semiconductor device 104 of FIG. 1.

Transport control logic 116 independently controls voltage 118, both shown in block form in FIG. 1, applied to each of the first electrode 128, second electrode 130, third electrode 132, and fourth electrode 134. As depicted, transport control logic 116 controls voltage 502 applied to first electrode 128, voltage 504 applied to second electrode 130, voltage 506 applied to third electrode 132, and voltage 508 applied to fourth electrode 134. By individually controlling voltage 502, voltage 504, voltage 506, and voltage 508, transport control logic 116 adiabatically transfers localization 510 of spin-polarized electron 120 along array of silicon quantum dot electrodes 110 of FIG. 1.

Figure 6:
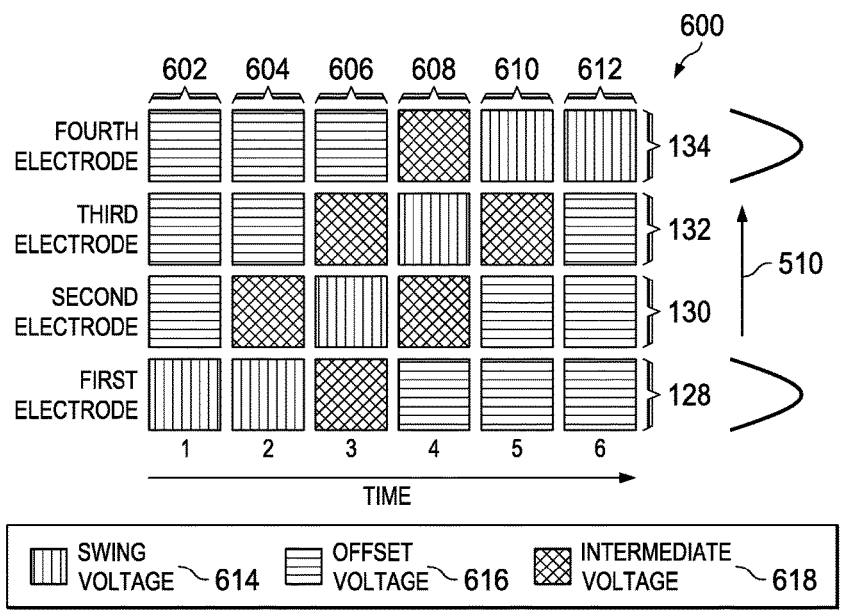
FIG. 6 is an illustration of transport control logic graphically depicting the adiabatic transfer of a spin-polarized electron along array of silicon quantum dot electrodes, depicted in accordance with an illustrative embodiment.

Referring now to FIG. 6, an illustration of transport control logic is graphically depicted for the adiabatic transfer of a spin-polarized electron along array of silicon quantum dot electrodes. Transport control logic 600 is an example of transport control logic 116, depicted in block form in FIG. 1. As depicted, transport control logic 600 individually controls voltage, such as voltage 502 of FIG. 5, applied to first electrode 128, voltage 504 of FIG. 5, applied to second electrode 130, voltage 506 of FIG. 5, applied to third electrode 132, and voltage 508 of FIG. 5, applied to fourth electrode 134.

At time 602, localization 510 of spin-polarized electron 120 is at first electrode 128. As depicted, transport control logic 600 maintains localization 510 of spin-polarized electron 120 by applying voltage 502 to first electrode 128. As depicted, voltage 502 is initially set at swing voltage 614. Swing voltage 614 is a voltage magnitude selected to maintain a desired energy gap, such as energy gap 126 of FIG. 1. As depicted, swing voltage 614 is greater than offset voltage 616 applied to electrodes in array of silicon quantum dot electrodes 110. As can be seen in graph 700 of FIG. 7, transport control logic 600 maintains desired energy gap 702 for spin-polarized electron 120 at time 602 by setting voltage 502 equal to swing voltage 614.

In one illustrative example, swing voltage 614 is greater than offset voltage 616 applied to each of the array of silicon quantum dot electrodes 110 by an amount of between 0.1 V and 1.0 V. In another illustrative example, swing voltage 614 is preferably greater than offset voltage 616 by an amount of between 0.5 V and 0.9V. In another illustrative example, swing voltage 614 is more preferably greater than offset voltage 616 by an amount of between 0.6 V and 0.8V. In another illustrative example, swing voltage 614 is most preferably greater than offset voltage 616 by an amount of 0.7V.

At time 604, transport control logic 600 begins to gradually increase voltage 504 at second electrode 130. As depicted, voltage 504 is increased at a rate such that the desired energy gap for spin-polarized electron 120 is maintained. As depicted, voltage 504 is gradually increased to intermediate voltage 618 over a selected time period. The time period can be, for example, one or more clock cycles for computer system 102, shown in block form in FIG. 1. As can be seen in graph 700, transport control logic 600 maintains desired energy gap 702 for spin-polarized electron 120 at time 604 by gradually increasing voltage 504 to intermediate voltage 618 while maintaining voltage 502 at swing voltage 614.

In one illustrative example, intermediate voltage 618 is greater than offset voltage 616 applied to each of the array of silicon quantum dot electrodes 110 by an amount of between 0.1 V and 1.0 V. In another illustrative example, intermediate voltage 618 is preferably greater than offset voltage 616 by an amount of between 0.2 V and 0.8V. In another illustrative example, intermediate voltage 618 is more preferably greater than offset voltage 616 by an amount of between 0.4 V and 0.6V. In another illustrative example, intermediate voltage 618 is most preferably greater than offset voltage 616 by an amount of 0.5V.

At time 606, transport control logic 600 has increased voltage 504 at second electrode 130 to swing voltage 614. Control logic 600 then holds voltage 504 at the swing voltage at second electrode 130. Simultaneously, transport control logic 600 gradually increase voltage 506 at third electrode 132, and decrease voltage 502 at first electrode 128. As depicted, voltage 504 is gradually increased from intermediate voltage 618 to swing voltage 614 over a selected time period. The time period can be, for example, one or more clock cycles for computer system 102, shown in block form in FIG. 1.

While increasing voltage 504, transport control logic 600 gradually increases voltage 506 at third electrode 132. As depicted, voltage 506 is gradually increased from offset voltage 616 to intermediate voltage 618 over the selected time period.

While holding voltage 504 at swing voltage 614, transport control logic 600 gradually decreases voltage 502 at first electrode 128. As depicted, voltage 502 is gradually decreased from swing voltage 614 to intermediate voltage 618 over the selected time period.

Figure 7:
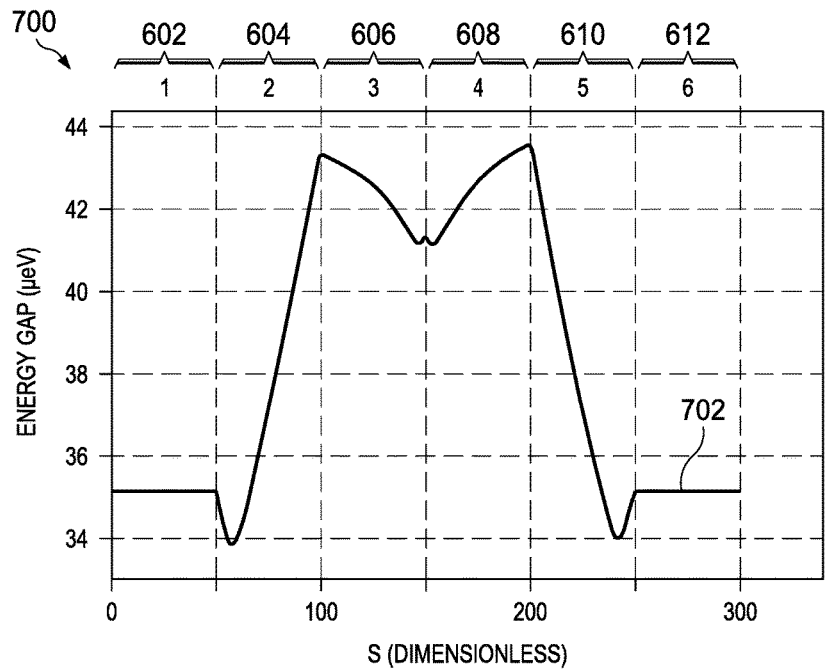
FIG. 7 is a graph of energy gaps measured during the adiabatic transfer of a spin-polarized electron along array of silicon quantum dot electrodes according to the transport control logic of FIG. 4, depicted in accordance with an illustrative embodiment.

As illustrated in FIG. 7, transport control logic 600 maintains desired energy gap 702 for spin-polarized electron 120 at time 606. By gradually increasing voltage 504 while simultaneously gradually increasing voltage 506 and gradually decreasing voltage 502, transport control logic 600 maintains the energy gap for spin-polarized electron 120 above desired energy gap 702 at time 606. Additionally, localization 510 of spin-polarized electron 120 is adiabatically transferred from first electrode 128 to second electrode 130.

At time 608, transport control logic 600 has increased voltage 506 at third electrode 132 to swing voltage 614. Control logic 600 then holds voltage 506 at the swing voltage at third electrode 132. Simultaneously, transport control logic 600 gradually increase voltage 508 at fourth electrode 134, decrease voltage 502 at first electrode 128, and decrease voltage 504 at second electrode 130. As depicted, voltage 506 is gradually increased from intermediate voltage 618 to swing voltage 616 over a selected time period. The time period can be, for example, one or more clock cycles for computer system 102, shown in block form in FIG. 1.

While holding voltage 506 at swing voltage 614, transport control logic 600 gradually increases voltage 508 at fourth electrode 134. As depicted, voltage 508 is gradually increased from voltage offset 616 to intermediate voltage 618 over the selected time period.

While holding voltage 506 at swing voltage 614, transport control logic 600 gradually decreases voltage 504 at second electrode 130. As depicted, voltage 504 is gradually decreased from swing voltage 614 to intermediate voltage 618 over the selected time period.

While increasing voltage 506, transport control logic 600 gradually decreases voltage 502 at first electrode 128. As depicted, voltage 502 is gradually decreased from intermediate voltage 618 to offset voltage 616 over the selected time period.

As illustrated in FIG. 7, transport control logic 600 maintains desired energy gap 702 for spin-polarized electron 120 at time 608. By gradually increasing voltage 506 while simultaneously gradually increase voltage 508, gradually decreasing voltage 504, and gradually decreasing voltage 502, transport control logic 600 maintains the energy gap for spin-polarized electron 120 above desired energy gap 702 at time 608. Additionally, localization 510 of spin-polarized electron 120 is adiabatically transferred from second electrode 130 to third electrode 132.

At time 610, transport control logic 600 has increased voltage 508 at fourth electrode 134 to swing voltage 614. Control logic 600 then holds voltage 508 at swing voltage 614 at fourth electrode 134. Simultaneously, transport control logic 600 gradually decrease voltage 506 at third electrode 132, and decrease voltage 504 at second electrode 130. As depicted, voltage 508 is gradually increased from intermediate voltage 618 to swing voltage 616 over a selected time period. The time period can be, for example, one or more clock cycles for computer system 102, shown in block form in FIG. 1.

While holding voltage 508 at swing voltage 614, transport control logic 600 gradually decreases voltage 506 at third electrode 132. As depicted, voltage 506 is gradually decreased from swing voltage 614 to intermediate voltage 618 over the selected time period.

While increasing voltage 508, transport control logic 600 gradually decreases voltage 504 at second electrode 130. As depicted, voltage 504 is gradually decreased from intermediate voltage 618 to offset voltage 616 over the selected time period.

As illustrated in FIG. 7, transport control logic 600 maintains desired energy gap 702 for spin-polarized electron 120 at time 610. By gradually increasing voltage 508 while simultaneously gradually decreasing voltage 506, and gradually decreasing voltage 504, transport control logic 600 maintains the energy gap for spin-polarized electron 120 above desired energy gap 702 at time 610. Additionally, localization 510 of spin-polarized electron 120 is adiabatically transferred from third electrode 132 to fourth electrode 134.

At time 612, transport control logic 600 has decreased voltage 506 at third electrode 132 to the offset voltage 616.

As depicted, voltage 508 is held at swing voltage 614 over this time period. The time period can be, for example, one or more clock cycles for computer system 102, shown in block form in FIG. 1.

As illustrated in FIG. 7, transport control logic 600 maintains desired energy gap 702 for spin-polarized electron 120 at time 612. Additionally, transport control logic 600 maintains localization 510 of spin-polarized electron 120 by applying voltage 508 at fourth electrode 134. By gradually decreasing voltage 506, transport control logic 600 maintains the energy gap for spin-polarized electron 120 above desired energy gap 702 at time 612.

Figure 8:
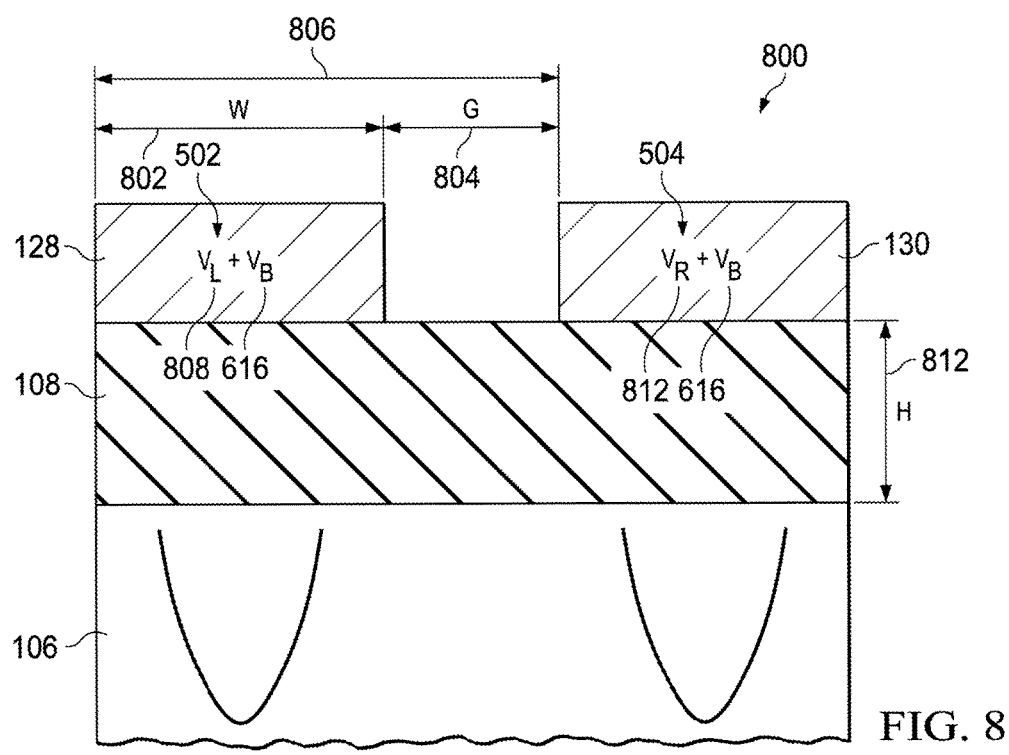
FIG. 8 is an illustration of various parameters for a silicon metal oxide semiconductor device, depicted according to an illustrative embodiment.

Referring now to FIG. 8, an illustration of various parameters for a silicon metal oxide semiconductor device is depicted according to an illustrative embodiment. Silicon metal oxide semiconductor device 800 is an example of a silicon metal oxide semiconductor device 104, shown in block form in FIG. 1.

As depicted, silicon metal oxide semiconductor device 800 includes a number of parameters optimized for the adiabatic transfer of spin-polarized electron along an array of silicon quantum dot electrodes.

As depicted, first electrode 128 has electrode width 802. electrode width 802 is the width of first electrode 128 deposited on oxide layer 108. As depicted, oxide layer 108 has oxide layer thickness 812. As depicted, second electrode 130 has a width substantially similar to electrode width 802 for first electrode 128. However, is appreciated that electrode width 802 for first electrode 128 may be the same or different from the width of other electrodes in array of silicon quantum dot electrodes 110, shown in block form in FIG. 1.

In one illustrative example, electrode width 802 is between 10 nm and 50 nm. In another illustrative example, electrode width 802 is preferably between 20 nm and 40 nm. In another illustrative example, electrode width 802 is more preferably between 25 nm and 35 nm. In another illustrative example, electrode width 802 is most preferably 30 nm.

As depicted, first electrode 128 is separated from second electrode 130 by inter-electrode gap 804. Inter-electrode gap 804 is a distance between first electrode 128 and subsequent second electrode 130, deposited on oxide layer 108. Electrode width 802 and inter-electrode gap 804 together define electrode pitch 806 for array of silicon quantum dot electrodes 110.

First electrode 128 has an electrode height as deposited on oxide layer 108. In one illustrative example, electrode height is between 10 nm and 50 nm. In another illustrative example, electrode height is preferably between 20 nm and 40 nm. In another illustrative example, electrode height is more preferably between 25 nm and 35 nm. In another illustrative example, electrode height is most preferably 30 nm.

As depicted, a transport control logic, such as transport control logic 116 depicted in block form in FIG. 1, independently controls voltage 502 at first electrode 128 and voltage 504 at second electrode 130. As depicted, voltage 502 and voltage 504 are maintained at least at offset voltage 616. Transport control logic 116 adiabatically transfers localization 510 of spin-polarized electron 120 from first electrode 128 to second electrode 130 by decreasing applied voltage 808 from swing voltage 614 while simultaneously increasing applied voltage 810 to swing voltage 614.

Figure 9:
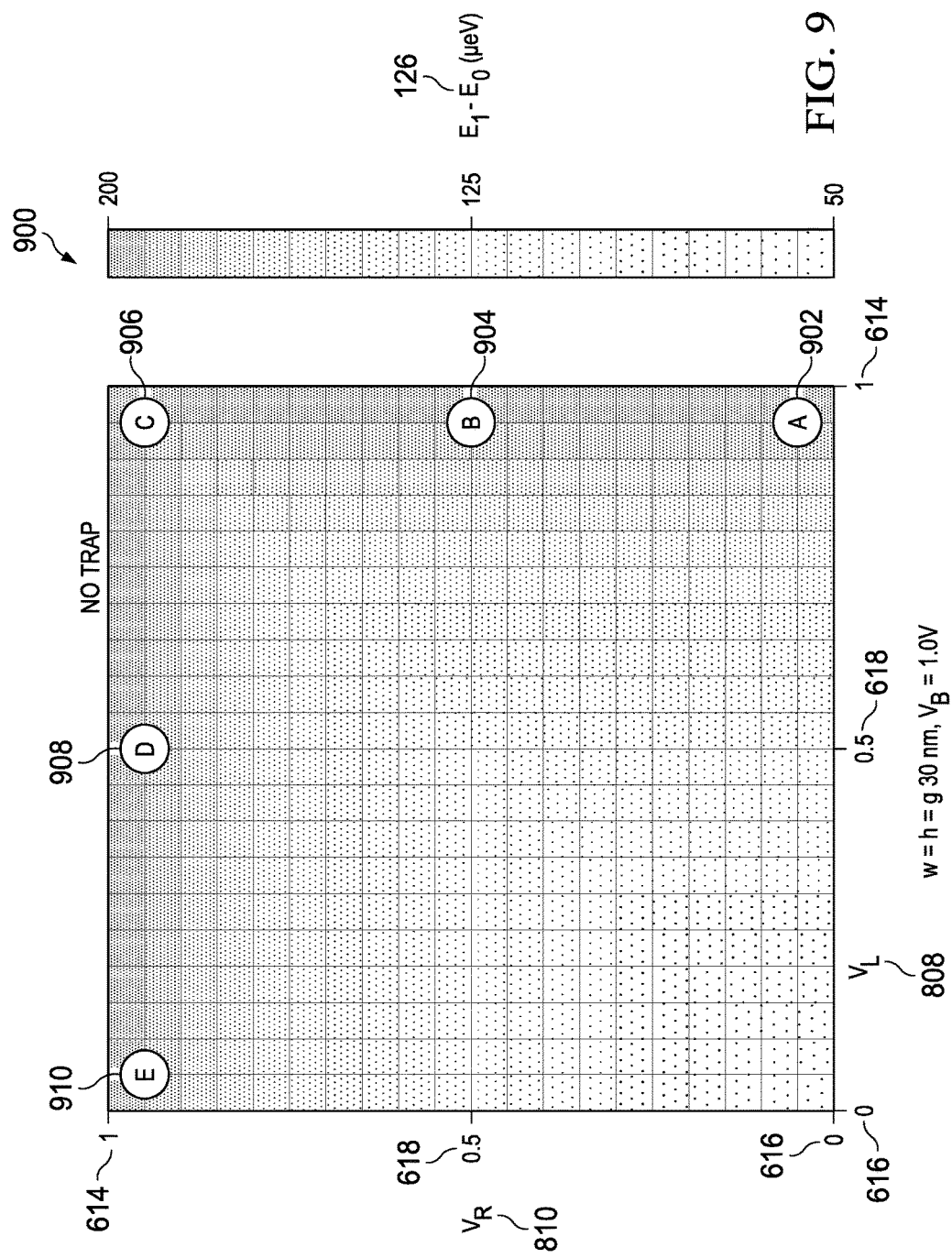
FIG. 9 is an illustration of measured energy gap for a spin-polarized electron during adiabatic transfer between adjacent electrodes, depicted according to an illustrative embodiment.

Referring now to FIG. 9, an illustration of measured energy gap for a spin-polarized electron during adiabatic transfer between adjacent electrodes is depicted according to an illustrative embodiment. As depicted, graph 900 illustrates energy gap, such as energy gap 126 of FIG. 1, at various applied voltages as localization of spin-polarized electron 120, such as localization 510 of FIG. 5, is adiabatically transferred from along an array of electrodes according to transport control logic 116.

As illustrated, energy gap 126 is greatest when either or both of applied voltage 808 and applied voltage 810 is equal to swing voltage 614. In one illustrative embodiment, transport control logic 116 increases applied voltage 810 to at least intermediate voltage 618 before decreasing applied voltage 808 from swing voltage 614. In another illustrative embodiment, transport control logic 116 increases applied voltage 810 to swing voltage 614 before decreasing applied voltage 808 from swing voltage 614. In this manner, transport control logic 116 maximizes energy gap 126 for spin-polarized electron 120.

Figure 10:
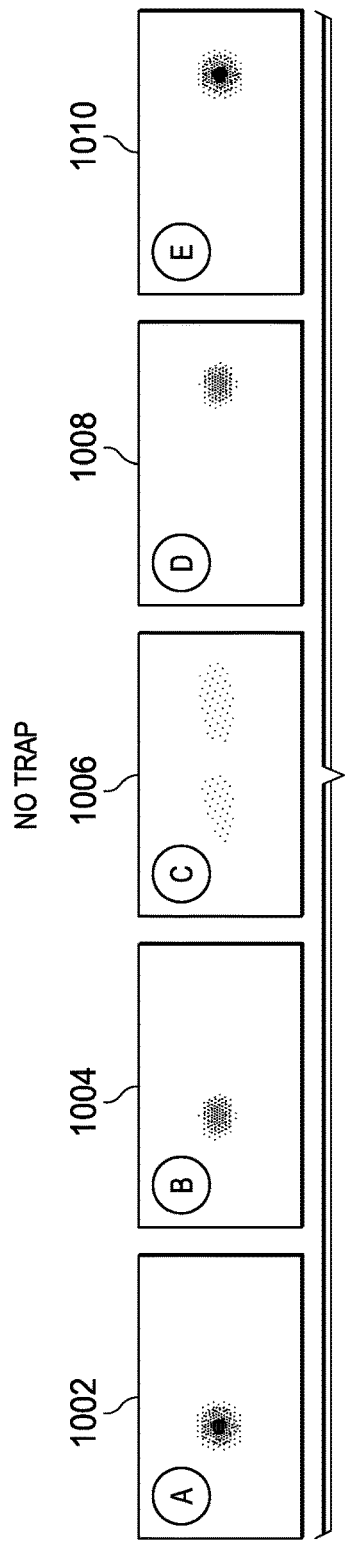
FIG. 10 is a series of photographs illustrating localization of a spin-polarized electron according to the voltage profiles of FIG. 9, depicted according to an illustrative embodiment.
Figure 11:
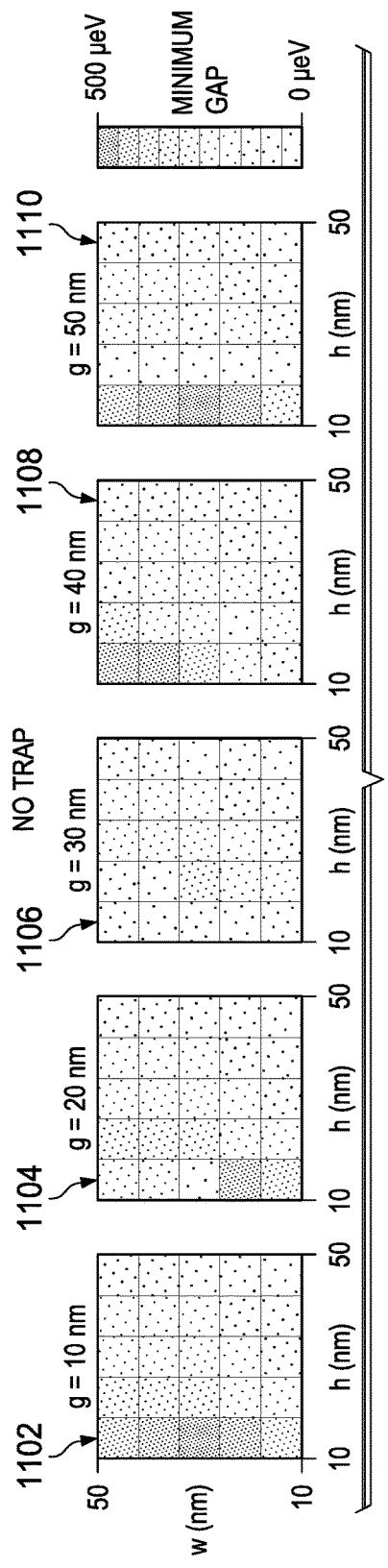
FIG. 11 is a series of sub-profiles, illustrating the effect of various electrode widths and electrode gaps on the localization of a spin-polarized electron according to the voltage profiles of FIG. 9, depicted according to an illustrative embodiment.

As can be seen at voltage profile 902, transport control logic 600 of FIG. 6 initially sets applied voltage 808 equal to swing voltage 614. In this manner, transport control logic 600 maximizes the measured energy gap 126 for spin-polarized electron 120 while maintaining localization 510 at first electrode 128. At voltage profile 902, localization 510 of spin-polarized electron 120 is at first electrode 128. Localization 510 of spin-polarized electron 120 according to voltage profile 902 is illustrated at photograph 1002 of FIG. 10. As shown in sub-profile 1102 of FIG. 11, the effect of various electrode widths and electrode gaps, such as electrode width 802 and inter-electrode gap 804 of FIG. 8, is illustrated according to voltage profile 902.

As can be seen at voltage profile 904, transport control logic 600 has gradually increased applied voltage 810 from offset voltage 616 to intermediate voltage 618. In this manner, transport control logic 600 maximizes the measured energy gap 126 for spin-polarized electron 120 while transferring localization 510. At voltage profile 904, localization 510 of spin-polarized electron 120 has migrated from first electrode 128. Localization 510 of spin-polarized electron 120 according to voltage profile 904 is illustrated at photograph 1004 of FIG. 10. As shown in sub-profile 1104 of FIG. 11, the effect of various electrode widths and electrode gaps, such as electrode width 802 and inter-electrode gap 804 of FIG. 8, is illustrated according to voltage profile 904.

As can be seen at voltage profile 906, transport control logic 600 has gradually increased applied voltage 810 from intermediate voltage 618 to swing voltage 614. In this manner, transport control logic 600 maximizes the measured energy gap 126 for spin-polarized electron 120 while transferring localization 510. At voltage profile 906, localization 510 of spin-polarized electron 120 is between first electrode 128 and second electrode 130. Localization 510 of spin-polarized electron 120 according to voltage profile 906 is illustrated at photograph 1006 of FIG. 10. As shown in sub-profile 1106 of FIG. 11, the effect of various electrode widths and electrode gaps, such as electrode width 802 and inter-electrode gap 804 of FIG. 8, is illustrated according to voltage profile 906.

As can be seen at voltage profile 908, transport control logic 600 has gradually decreased applied voltage 808 from swing voltage 614 to intermediate voltage 618. In this manner, transport control watch 600 maximizes the measured energy gap 126 for spin-polarized electron 120 while transferring localization 510. At voltage profile 908, localization 510 of spin-polarized electron 120 has migrated toward second electrode 130. Localization 510 of spin-polarized electron 120 according to voltage profile 908 is illustrated at photograph 1004 of FIG. 10. As shown in sub-profile 1108 of FIG. 11, the effect of various electrode widths and electrode gaps, such as electrode width 802 and inter-electrode gap 804 of FIG. 8, is illustrated according to voltage profile 908.

As can be seen at voltage profile 910, transport control logic 600 has gradually decreased applied voltage 808 from intermediate voltage 618 to offset voltage 616. In this manner, transport control logic 600 maximizes the measured energy gap 126 for spin-polarized electron 120 while maintaining localization 510 at second electrode 130. At voltage profile 910, localization 510 of spin-polarized electron 120 is at second electrode 130. Localization 510 of spin-polarized electron 120 according to voltage profile 910 is illustrated at photograph 1010 of FIG. 10. As shown in sub-profile 1110 of FIG. 11, the effect of various electrode widths and electrode gaps, such as electrode width 802 and inter-electrode gap 804 of FIG. 8, is illustrated according to voltage profile 910.

Figure 12:
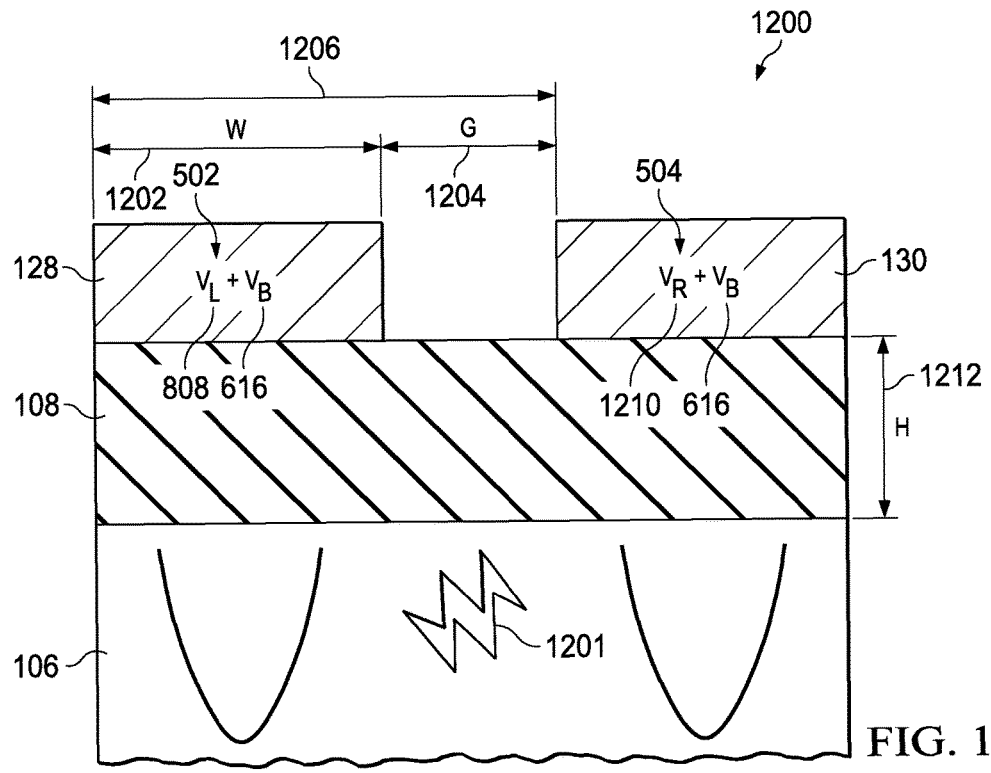
FIG. 12 is an illustration of various parameters for a silicon metal oxide semiconductor device in the presence of a 1 meV trap, depicted according to an illustrative embodiment

Referring now to FIG. 12, an illustration of various parameters for a silicon metal oxide semiconductor device is depicted according to an illustrative embodiment. Silicone metal oxide semiconductor device 1200 is an example of a silicone metal oxide semiconductor device 104, shown in block form in FIG. 1. As depicted, silicon metal oxide semiconductor device 1200 includes 1 meV trap 1201 in semi-conducting silicon layer 106.

As depicted, silicon metal oxide semiconductor device 1200 includes a number of parameters optimized for the adiabatic transfer of spin-polarized electron along an array of silicon quantum dot electrodes.

As depicted, first electrode 128 has electrode width 1202. Electrode width 1202 is the width of first electrode 128 deposited on oxide layer 108. As depicted, oxide layer 108 has oxide layer thickness 1212. As depicted, second electrode 130 has a width substantially similar to electrode width 1202 for first electrode 128. However, is appreciated that electrode width 1202 for first electrode 128 may be the same or different from the width of other electrodes in array of silicon quantum dot electrodes 110, shown in block form in FIG. 1.

As depicted, first electrode 128 is separated from second electrode 130 by inter-electrode gap 1204. Inter-electrode gap 1204 is a distance between first electrode 128 and subsequent second electrode 130, deposited on oxide layer 108. Electrode width 1202 and inter-electrode gap 1204 together define electrode pitch 1206 for array of silicon quantum dot electrodes 110.

As depicted, a transport control logic, such as transport control logic 116 depicted in block form in FIG. 1, independently controls voltage 502 at first electrode 128 and voltage 504 at second electrode 130. As depicted, voltage 502 and voltage 504 are maintained at least at offset voltage 616. Transport control logic 116 adiabatically transfers localization 510 of spin-polarized electron 120 from first electrode 128 to second electrode 130 by decreasing applied voltage 1208 from swing voltage 614 while simultaneously increasing applied voltage 1210 to swing voltage 614.

Figure 13:
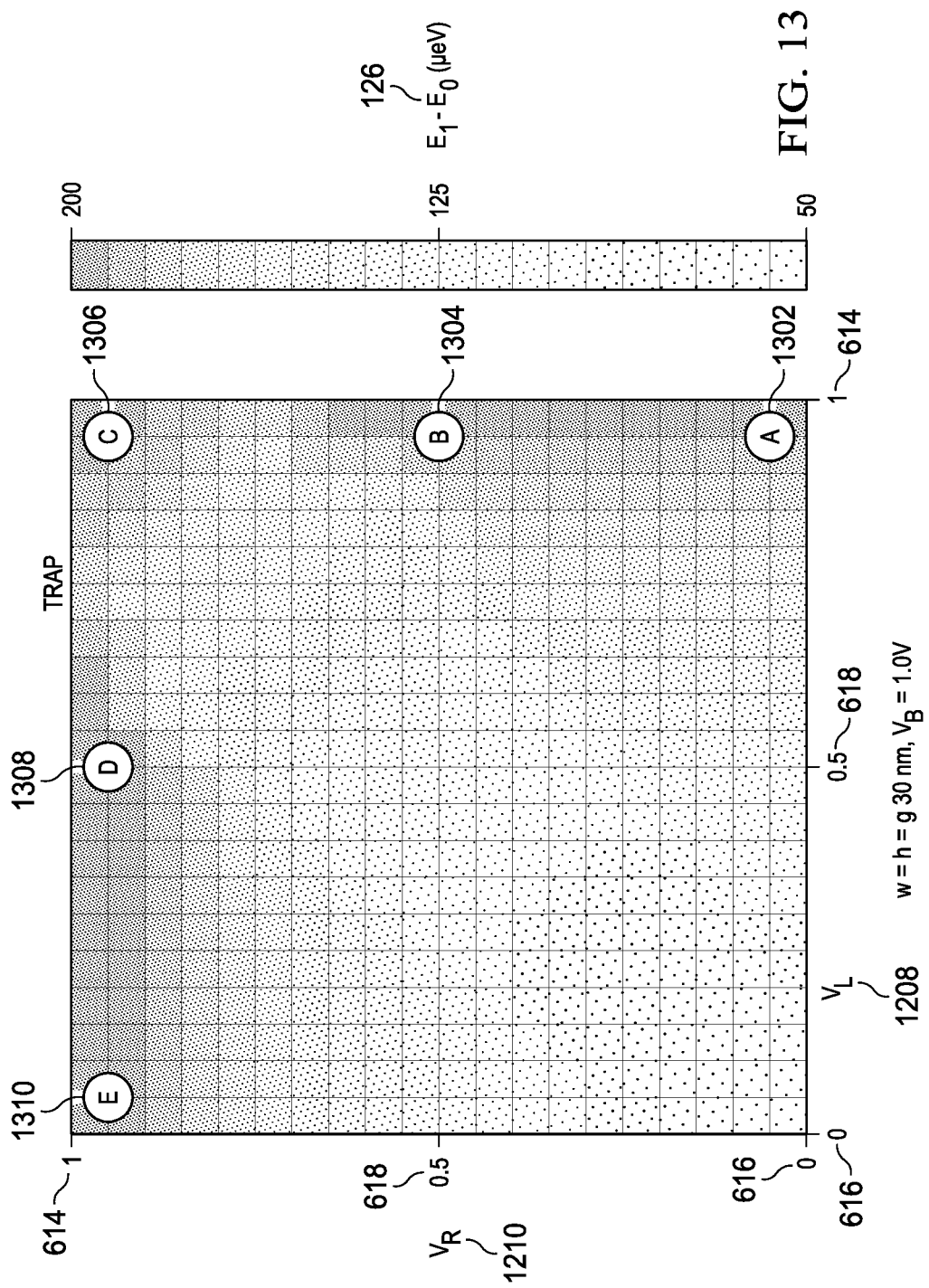
FIG. 13 is an illustration of measured energy gap for a spin-polarized electron during adiabatic transfer between adjacent electrodes in the presence of a 1 meV trap, depicted according to an illustrative embodiment.

Referring now to FIG. 13, an illustration of measured energy gap for a spin-polarized electron during adiabatic transfer between adjacent electrodes is depicted according to an illustrative embodiment. As depicted, graph 1300 illustrates energy gap 126 at various applied voltages as localization 510 of spin-polarized electron 120 is adiabatically transferred from first electrode 128 to second electrode 130 in the presence of 1 meV trap 1201 according to transport control logic 116.

As illustrated, energy gap 126 is greatest when either or both of applied voltage 1208 and applied voltage 1210 is equal to swing voltage 614. In one illustrative embodiment, Transport control logic 116 increases applied voltage 1210 to at least intermediate voltage 618 before decreasing applied voltage 1208 from swing voltage 614. In another illustrative embodiment, transport control logic 116 increases applied voltage 1210 to swing voltage 614 before decreasing applied voltage 1208 from swing voltage 614. In this manner, transport control logic 116 maximizes energy gap 126 for spin-polarized electron 120.

Figure 14:
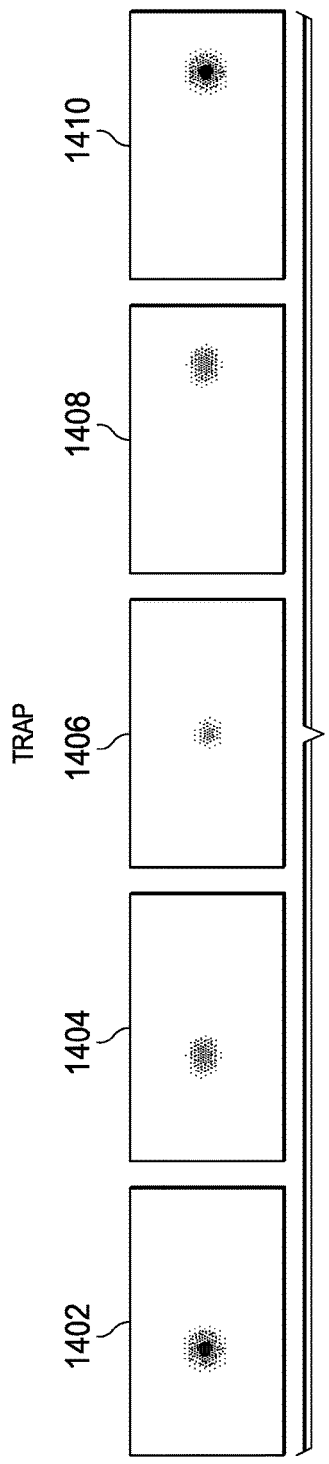
FIG. 14 is a series of photographs illustrating localization of a spin-polarized electron according to the voltage profiles of FIG. 11, depicted according to an illustrative embodiment.
Figure 15:
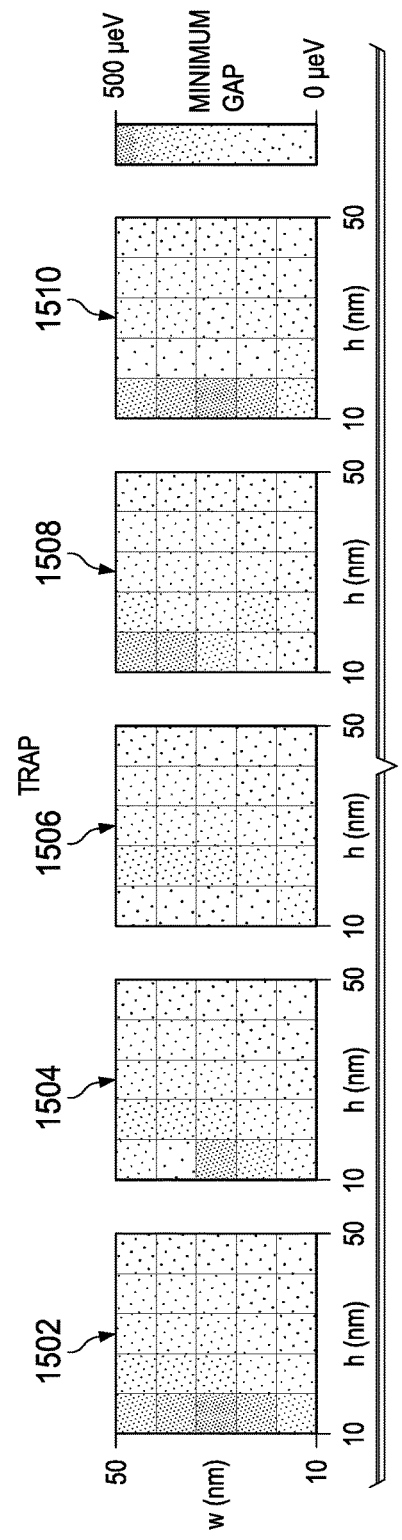
FIG. 15 is a series of sub-profiles, illustrating the effect of various electrode widths and electrode gaps on the localization of a spin-polarized electron according to the voltage profiles of FIG. 11, depicted according to an illustrative embodiment.

As can be seen at voltage profile 1302, transport control logic 600 of FIG. 6 initially sets applied voltage 1208 equal to swing voltage 614. In this manner, transport control logic 600 maximizes the measured energy gap 126 for spin-polarized electron 120 while maintaining localization 510 at first electrode 128. At voltage profile 1302, localization 510 of spin-polarized electron 120 is at first electrode 128. Localization 510 of spin-polarized electron 120 according to voltage profile 902 is illustrated at photograph 1402 of FIG. 14. As shown in sub-profile 1502 of FIG. 15, the effect of various electrode widths and electrode gaps, such as electrode width 1202 and inter-electrode gap 1204 of FIG. 12, is illustrated according to voltage profile 1302.

As can be seen at voltage profile 1304, transport control logic 116 has gradually increased applied voltage 1210 from offset voltage 616 to intermediate voltage 618. In this manner, transport control logic 600 maximizes the measured energy gap 126 for spin-polarized electron 120 while transferring localization 510. At voltage profile 1304, localization 510 of spin-polarized electron 120 has migrated from first electrode 128. Localization 510 of spin-polarized electron 120 according to voltage profile 1304 is illustrated at photograph 1404 of FIG. 14. As shown in sub-profile 1504 of FIG. 15, the effect of various electrode widths and electrode gaps, such as electrode width 1202 and inter-electrode gap 1204 of FIG. 12, is illustrated according to voltage profile 1304.

As can be seen at voltage profile 1306, transport control logic 600 has gradually increased applied voltage 1210 from intermediate voltage 618 to swing voltage 614. In this manner, transport control logic 600 maximizes the measured energy gap 126 for spin-polarized electron 120 while transferring localization 510. At voltage profile 1306, localization 510 of spin-polarized electron 120 is between first electrode 128 and second electrode 130. Localization 510 of spin-polarized electron 120 according to voltage profile 906 is illustrated at photograph 1406 of FIG. 14. As shown in sub-profile 1506 of FIG. 15, the effect of various electrode widths and electrode gaps, such as electrode width 1202 and inter-electrode gap 1204 of FIG. 12, is illustrated according to voltage profile 1306.

As can be seen at voltage profile 1308, transport control logic 600 has gradually decreased applied voltage 1208 from swing voltage 614 to intermediate voltage 618. In this manner, transport control logic 600 maximizes the measured energy gap 126 for spin-polarized electron 120 while transferring localization 510. At voltage profile 1308, localization 510 of spin-polarized electron 120 has migrated toward second electrode 130. Localization 510 of spin-polarized electron 120 according to voltage profile 1308 is illustrated at photograph 1408 of FIG. 14. As shown in sub-profile 1508 of FIG. 15, the effect of various electrode widths and electrode gaps, such as electrode width 1202 and inter-electrode gap 1204 of FIG. 12, is illustrated according to voltage profile 1308.

As can be seen at voltage profile 1310, transport control logic 600 has gradually decreased applied voltage 1208 from intermediate voltage 618 to offset voltage 616. In this manner, transport control logic 600 maximizes the measured energy gap 126 for spin-polarized electron 120 while maintaining localization 510 at second electrode 130. At voltage profile 1310, localization 510 of spin-polarized electron 120 is at second electrode 130. Localization 510 of spin-polarized electron 120 according to voltage profile 1310 is illustrated at photograph 1410 of FIG. 14. As shown in sub-profile 1510 of FIG. 15, the effect of various electrode widths and electrode gaps, such as electrode width 1202 and inter-electrode gap 1204 of FIG. 12, is illustrated according to voltage profile 1310.

Figure 16:
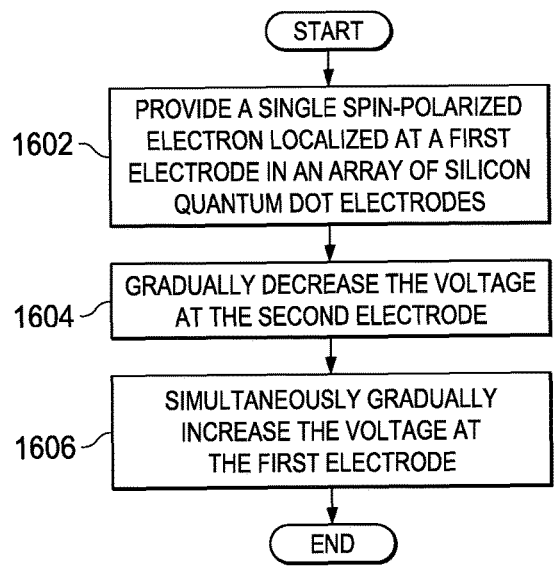
FIG. 16 is an illustration of a high-level flowchart of a process for transporting a spin-polarized single electron, depicted in accordance with an illustrative embodiment.

With reference now to FIG. 16, an illustration of a high-level flowchart of a process for transporting a spin-polarized single electron is depicted in accordance with an illustrative embodiment. The process illustrated FIG. 16 may be implemented in spin-based electronic environment 100 in FIG. 1. For example, the process may be implemented in transport control logic 116 in FIG. 1. This process is implemented for transporting a spin-polarized single electron along an array of silicon quantum dot electrodes of a silica metal oxide semiconductor device, such as silicon metal oxide semiconductor device 104 in FIG. 1.

The process begins by providing a single spin-polarized electron localized at a first electrode in an array of silicon quantum dot electrodes (step 1602). The spin-polarized electron may be, for example, spin-polarized electron 120, shown in block form in FIG. 1. In one illustrative example, the spin-polarized electron is localized at the first electrode by a voltage applied at the first electrode.

The process then gradually increases the voltage at a second electrode (step 1604). While increasing the voltage at the second electrode, the process gradually decreases the voltage at the first electrode (step 1606), with the process terminating thereafter. By simultaneously increasing the voltage at the first electrode while decreasing the voltage at the second electrode, localization of the single electron is adiabatically transferred from the first electrode to the second electrode while maintaining a desired energy gap between a ground state and a first excited state of the single electron.

Figure 17:
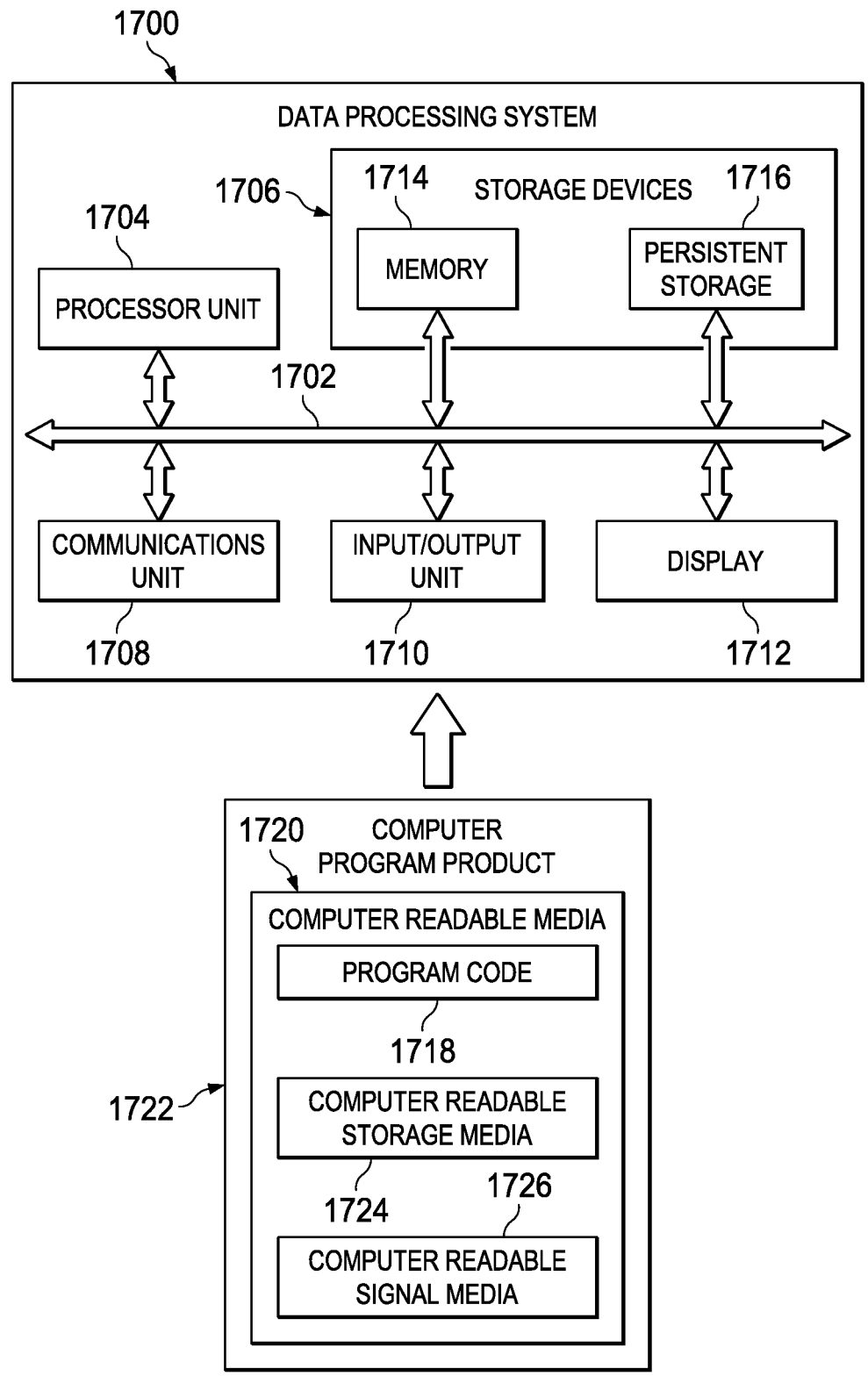
FIG. 17 is an illustration of a block diagram of a data processing system, depicted in accordance with an illustrative embodiment.

Turning now to FIG. 17, an illustration of a block diagram of a data processing system is depicted in accordance with an illustrative embodiment. Data processing system 1700 may be used to implement data processing systems in computer system 102. In this illustrative example, data processing system 1700 includes communications framework 1702, which provides communications between processor unit 1704, memory 1706, persistent storage 1708, communications unit 1710, input/output unit 1712, and display 1714. In this example, communications framework 1702 may take the form of a bus system for transporting information as spin-polarized single electrons.

Processor unit 1704 serves to execute instructions for software that may be loaded into memory 1706. Processor unit 1704 may be a number of processors, a multi-processor core, or some other type of processor, depending on the particular implementation.

Memory 1706 and persistent storage 1708 are examples of storage devices 1716. A storage device is any piece of hardware that is capable of storing information, such as, for example, without limitation, at least one of data, program code in functional form, or other suitable information either on a temporary basis, a permanent basis, or both on a temporary basis and a permanent basis. Storage devices 1716 may also be referred to as computer readable storage devices in these illustrative examples. Memory 1706, in these examples, may be, for example, a random access memory or any other suitable volatile or non-volatile storage device. Persistent storage 1708 may take various forms, depending on the particular implementation.

For example, persistent storage 1708 may contain one or more components or devices. For example, persistent storage 1708 may be a hard drive, a solid state hard drive, a flash memory, a rewritable optical disk, a rewritable magnetic tape, or some combination of the above. The media used by persistent storage 1708 also may be removable. For example, a removable hard drive may be used for persistent storage 1708.

Communications unit 1710, in these illustrative examples, provides for communications with other data processing systems or devices. In these illustrative examples, communications unit 1710 is a network interface card.

Input/output unit 1712 allows for input and output of data with other devices that may be connected to data processing system 1700. For example, input/output unit 1712 may provide a connection for user input through at least one of a keyboard, a mouse, or some other suitable input device. Further, input/output unit 1712 may send output to a printer. Display 1714 provides a mechanism to display information to a user.

Instructions for at least one of the operating system, applications, or programs may be located in storage devices 1716, which are in communication with processor unit 1704 through communications framework 1702. The processes of the different embodiments may be performed by processor unit 1704 using computer-implemented instructions, which may be located in a memory, such as memory 1706.

These instructions are referred to as program code, computer usable program code, or computer readable program code that may be read and executed by a processor in processor unit 1704. The program code in the different embodiments may be embodied on different physical or computer readable storage media, such as memory 1706 or persistent storage 1708.

Program code 1718 is located in a functional form on computer readable media 1720 that is selectively removable and may be loaded onto or transferred to data processing system 1700 for execution by processor unit 1704. Program code 1718 and computer readable media 1720 form computer program product 1722 in these illustrative examples. In one example, computer readable media 1720 may be computer readable storage media 1724 or computer readable signal media 1726.

In these illustrative examples, computer readable storage media 1724 is a physical or tangible storage device used to store program code 1718 rather than a medium that propagates or transmits program code 1718.

Alternatively, program code 1718 may be transferred to data processing system 1700 using computer readable signal media 1726. Computer readable signal media 1726 may be, for example, a propagated data signal containing program code 1718. For example, computer readable signal media 1726 may be at least one of an electromagnetic signal, an optical signal, or any other suitable type of signal. These signals may be transmitted over at least one of communications links, such as wireless communications links, optical fiber cable, coaxial cable, a wire, or any other suitable type of communications link.

The different components illustrated for data processing system 1700 are not meant to provide architectural limitations to the manner in which different embodiments may be implemented. The different illustrative embodiments may be implemented in a data processing system including components in addition to or in place of those illustrated for data processing system 1700. Other components shown in FIG. 17 can be varied from the illustrative examples shown. The different embodiments may be implemented using any hardware device or system capable of running program code 1718.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component may be configured to perform the action or operation described. For example, the component may have a configuration or design for a structure that provides the component an ability to perform the action or operation that is described in the illustrative examples as being performed by the component.

Thus, the illustrative examples provide one or more technical solutions that overcome a technical problem of shuttling spin-based information bits in a silicon metal oxide semiconductor computer system. As a result, one or more technical solutions may provide a technical effect in which spin-based information bits in a silicon metal oxide semiconductor computer system may be shuttled while maintaining a desired transport fidelity.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A silicon metal-oxide semiconductor device for transporting a spin-polarized single electron, comprising:
    an array of silicon quantum dot electrodes arranged atop a silicon dioxide layer of a silicon metal-oxide semiconductor, wherein the array comprises at least a first electrode and a second electrode adjacent to the first electrode; and
    a transport control logic for individually controlling a voltage applied to the electrodes, wherein the transport control logic is configured to gradually increase a voltage at the second electrode while gradually decreasing a voltage at the first electrode such that localization of the single electron is adiabatically transferred from the first electrode to the second electrode while maintaining a desired energy gap between a ground state and a first excited state of the single electron.

2. The silicon metal-oxide semiconductor device of claim 1, wherein the voltage at the first electrode is initially a swing voltage, wherein the swing voltage is selected to maintain the desired energy gap of the single electron, such that the single electron remains localized at the first electrode.

3. The silicon metal-oxide semiconductor device of claim 2, wherein the swing voltage is greater than an offset voltage applied to each of the array of silicon quantum dot electrodes by an amount of between 0.1 V and 1.0 V.

4. The silicon metal-oxide semiconductor device of claim 2, wherein the transport control logic is further configured:
    to gradually increase the voltage at the second electrode from an offset voltage applied to each of the array of silicon quantum dot electrodes to at least an intermediate voltage prior to decreasing the voltage at the first electrode from the swing voltage, wherein the intermediate voltage is less than the swing voltage and greater than the offset voltage.

5. The silicon metal-oxide semiconductor device of claim 4, wherein the transport control logic is further configured:
to gradually increase the voltage at the second electrode from the intermediate voltage to the swing voltage; and
while increasing the voltage at the second electrode from the intermediate voltage to the swing voltage, to gradually increase the voltage at a third electrode in the array of silicon quantum dot electrodes and adjacent to the second electrode, wherein the voltage at the third electrode is increased from the offset voltage to at least the intermediate voltage such that the desired energy gap of the single electron is maintained.

6. The silicon metal-oxide semiconductor device of claim 5, wherein the transport control logic is further configured:
to gradually increase the voltage at the third electrode from the intermediate voltage to the swing voltage; and
while increasing the voltage at the third electrode from the intermediate voltage to the swing voltage, to gradually decrease the voltage at the first electrode from the intermediate voltage to the offset voltage and to gradually decrease the voltage at the second electrode from the swing voltage to the intermediate voltage such that localization of the single electron is adiabatically transferred from the first electrode to the second electrode while maintaining a desired energy gap between a ground state and a first excited state of the single electron.

7. The silicon metal-oxide semiconductor device of claim 4, wherein the intermediate voltage is greater than an offset voltage applied to each of the array of silicon quantum dot electrodes by an amount of between 0.1 V and 1.0 V.

8. The silicon metal-oxide semiconductor device of claim 1, wherein a gate pitch and a gate height for the array of silicon quantum dot electrodes is selected to maintain a desired level of transfer fidelity for the spin polarization of the single electron.

9. The silicon metal-oxide semiconductor device of claim 8, wherein a gate width of the array of silicon quantum dot electrodes is an amount of between 10 and 50 nm.

10. The silicon metal-oxide semiconductor device of claim 8, wherein a gate gap of the array of silicon quantum dot electrodes is an amount of between 10 and 50 nm.

11. The silicon metal-oxide semiconductor device of claim 1, wherein a gate height of the array of silicon quantum dot electrodes is an amount of between 10 and 50 nm.

12. A method for transporting a spin-polarized single electron in a silicon metal-oxide semiconductor device, the method comprising:
providing a single spin-polarized electron localized at a first electrode in an array of silicon quantum dot electrodes by a voltage applied at the first electrode, wherein the array comprises at least the first electrode and a second electrode adjacent to the first electrode;
gradually decreasing the voltage at the first electrode; and
while decreasing the voltage at the first electrode, gradually increasing a voltage at the second electrode such that localization of the single electron is adiabatically transferred from the first electrode to the second electrode while maintaining a desired energy gap between a ground state and a first excited state of the single electron.

13. The method of claim 12, wherein the voltage at the first electrode is initially a swing voltage, wherein the swing voltage is selected to maintain the desired energy gap of the single electron, such that the single electron remains localized at the first electrode.

14. The method of claim 13, further comprising:
gradually increasing the voltage at the second electrode from an offset voltage applied to each of the array of silicon quantum dot electrodes to at least an intermediate voltage prior to decreasing the voltage at the first electrode from the swing voltage, wherein the intermediate voltage is less than the swing voltage and greater than the offset voltage.

15. The method of claim 14, further comprising:
gradually increasing the voltage at the second electrode from the intermediate voltage to the offset voltage; and
while increasing the voltage at the second electrode from the intermediate voltage to the swing voltage, gradually increasing the voltage at a third electrode in the array of silicon quantum dot electrodes and adjacent to the second electrode, wherein the voltage at the third electrode is increased from the offset voltage to at least the intermediate voltage such that the desired energy gap of the single electron is maintained.

16. The method of claim 15, further comprising:
while increasing the voltage at the second electrode from the second voltage to the first voltage, gradually decreasing the voltage at the first electrode from the swing voltage to the intermediate voltage.

17. The method of claim 16, further comprising:
gradually increasing the voltage at the third electrode from the intermediate voltage to the swing voltage; and
while increasing the voltage at the third electrode from the intermediate voltage to the swing voltage, gradually decreasing the voltage at the first electrode from the intermediate voltage to the offset voltage and gradually decreasing the voltage at the second electrode from the swing voltage to the intermediate voltage such that localization of the single electron is adiabatically transferred from the second electrode to the third electrode while maintaining a desired energy gap between a ground state and a first excited state of the single electron.

18. A computer program product for transporting information indicated by a spin polarization of a single electron in a silicon metal-oxide semiconductor device processing data, the computer program product comprising:
a non-transitory, tangible computer readable storage media;
first program code, stored on the computer readable storage media, for providing a single spin-polarized electron localized at a first electrode in an array of silicon quantum dot electrodes by a voltage applied at the first electrode, wherein the array comprises at least the first electrode and a second electrode adjacent to the first electrode;
second program code, stored on the computer readable storage media, for gradually decreasing the voltage at the first electrode; and
third program code, stored on the computer readable storage media, for gradually increasing a voltage at the second electrode while decreasing the voltage at the first electrode, such that localization of the single electron is adiabatically transferred from the first electrode to the second electrode while maintaining a desired energy gap between a ground state and a first excited state of the single electron.

19. The computer program product of claim 18, wherein the voltage at the first electrode is initially a swing voltage, wherein the swing voltage is selected to maintain the desired energy gap of the single electron, such that the single electron remains localized at the first electrode, wherein the third program code further comprises:
   program code, stored on the computer readable storage media, for gradually increasing the voltage at the second electrode from an offset voltage applied to each of the array of silicon quantum dot electrodes to at least an intermediate voltage prior to decreasing the voltage at the first electrode from the swing voltage, wherein the intermediate voltage is less than the swing voltage and greater than the offset voltage.

20. The computer program product of claim 19:
   wherein the third program code further comprises program code, stored on the computer readable storage media, for gradually increasing the voltage at the second electrode from the intermediate voltage to the swing voltage; and
   wherein the computer program product further comprises:
   fourth program code, stored on the computer readable storage media, for gradually increasing the voltage at a third electrode in the array of silicon quantum dot electrodes and adjacent to the second electrode while increasing the voltage at the second electrode from the intermediate voltage to the swing voltage, wherein the voltage at the third electrode is increased from the offset voltage to at least the intermediate voltage such that the desired energy gap of the single electron is maintained.

21. The computer program product of claim 20, wherein the first program code further comprises:
   program code, stored on the computer readable storage media, for gradually decreasing the voltage at the first electrode from the swing voltage to the intermediate voltage while increasing the voltage at the second electrode from the intermediate voltage to the swing voltage.

22. The computer program product of claim 21, wherein the fourth program code further comprises:
   program code, stored on the computer readable storage media, for gradually increasing the voltage at the third electrode from the intermediate voltage to the swing voltage; and
   wherein the second program code further comprises program code, stored on the computer readable storage media, for gradually decreasing the voltage at the first electrode from the intermediate voltage to the offset voltage while increasing the voltage at the third electrode from the intermediate voltage to the swing voltage; and
   wherein the computer program product further comprises:
   fifth program code, stored on the computer readable storage media, for gradually decreasing the voltage at the second electrode from the swing voltage to the intermediate voltage.

23. A computer system comprising:
   a silicon metal-oxide bus system, wherein the bus is configured to transport a spin polarization of a single electron by providing a single spin-polarized electron localized at a first electrode in an array of silicon quantum dot electrodes; gradually decreasing a voltage at the first electrode; and while decreasing the voltage at the first electrode, gradually increasing a voltage at a second electrode in the array of silicon quantum dot electrodes and adjacent to the first electrode, such that localization of the single electron is adiabatically transferred from the first electrode to the second electrode while maintaining a desired energy gap between a ground state and a first excited state of the single electron.

* * * * *